US006043596A

United States Patent [19]

Lakshmanan

[11] Patent Number: 6,043,596
[45] Date of Patent: Mar. 28, 2000

[54] COMPOSITE SHADOW MASK AND CATHODE RAY TUBE INCORPORATING SAME

[75] Inventor: Venugopal Lakshmanan, Ann Arbor, Mich.

[73] Assignee: Philips Electronics North America Corporation, New York, N.Y.

[21] Appl. No.: 08/984,826

[22] Filed: Dec. 4, 1997

[51] Int. Cl.[7] .......................... H01J 29/80; G03C 05/00; G03F 09/00

[52] U.S. Cl. .......................... 313/402; 313/407; 430/23; 430/5

[58] Field of Search .................................... 313/402, 403, 313/404, 405, 406, 407, 408; 430/5, 23; 216/12; 156/306.3; 445/37, 47

[56] References Cited

U.S. PATENT DOCUMENTS 5,686,784 11/1997 Thoms et al. .......................... 313/402
5,797,781 8/1998 Yoon .......................... 445/37
5,863,681 1/1999 Helmetag .......................... 430/23

FOREIGN PATENT DOCUMENTS 62-82630 4/1987 Japan .......................... H01J 29/07
62-82631 4/1987 Japan .......................... H01J 29/07

*Primary Examiner*—Michael H. Day
*Assistant Examiner*—Mack Haynes
*Attorney, Agent, or Firm*—John C. Fox

[57] ABSTRACT

A color CRT has a shadow mask formed from a bilayer composite of steel and invar. The thicknesses of steel and invar are chosen to take advantage of the lower thermal expansion coefficient of invar and the room temperature formability and higher modulus of elasticity of steel. Such composite masks exhibit reduced doming when compared to steel masks, and can be formed at room temperature.

6 Claims, 3 Drawing Sheets

COMPOSITE SHADOW MASK AND CATHODE RAY TUBE INCORPORATING SAME

BACKGROUND OF THE INVENTION

This invention relates to cathode ray tubes (CRTs) for color television and other display applications, and more particularly relates to the shadow mask which is employed to obtain registration of the electron beams from the electron gun with the phosphor elements in the display screen.

Most CRTs for color television and other display applications, such as computer monitors, employ a shadow mask, a thin metal sheet having a very large number of apertures, to achieve registration of the scanning electron beams from the electron gun with the cathodoluminescent phosphor elements which constitute the display screen.

The apertures are sized and positioned to allow only a portion of each beam to pass through and land on the correct phosphor element. While some portion of the beam not passing through an aperture is scattered, a much larger portion is absorbed by the mask material and converted to heat. Due to the low mass and high thermal expansion coefficient of the thin metal mask, it heats up and expands at a faster rate than surrounding structures, causing the mask to "dome", ie, move closer to the screen, causing misregistration between the electron beams and the screen. Such misregistration lowers resolution and color purity of the display. Such doming is most severe during the initial warm up phase of operation, but can also occur during normal tube operation, caused for example, by local areas of high intensity in the display image. The latter effect is referred to as "local doming".

The trend toward higher resolution in the tv industry, and the higher resolution requirements of the computer industry in general, has led to efforts to minimize doming in such color CRTs. One approach has been to replace the traditional steel masks with masks made from invar, an alloy of 36% by weight nickel, remainder iron and impurities, because such masks have a lower coefficient of thermal expansion than do steel masks. However, invar is a more expensive material than steel. Moreover, invar has a higher yield stress, and must be formed at elevated temperatures. In addition, invar masks, due to their lower modulus of elasticity, have a greater tendency to buckle under mechanical shock than do steel masks. These factors all lead to an overall increase in the cost of the CRT.

Japanese patent application JP 62-82630 teaches forming a shadow mask from a composite material consisting of an inner core of an invar sheet sandwiched between two outer steel sheets. The volume ratio between the outer steel layers and the inner invar layer is kept within the range of 0.15 to 0.50, below which the modulus of elasticity is said to deteriorate too much, and above which the coefficient of thermal expansion is said to be excessive.

Japanese patent application JP 62-82631 teaches forming a shadow mask from a composite material consisting of an inner core of a steel sheet between two outer invar sheets. The volume ratio between the inner steel layer and the outer invar layers is kept within the range of 0.15 to 0.50, below which the modulus of elasticity is said to deteriorate too much, and above which the coefficient of thermal expansion is said to be excessive.

A table common to both Japanese applications presents values for average thermal expansion coefficient, 0.2% proof stress and elasticity coefficient, for different values of the ratio of the inner to outer layers of the composites. It can be calculated that in both composite structures, invar ranges from 67% to 87% and steel ranges from 13% to 33% volume %.

Such three-layer composites tend to be difficult and costly to fabricate, particularly because of the high percentage of invar present. Furthermore, such a high percentage of invar means that the 0.2% proof stress of these composites is still in the range which requires forming of the shadow masks at elevated temperatures.

OBJECTS AND SUMMARY OF THE INVENTION

Accordingly, it is an object of the invention to provide a shadow mask for a color CRT which has a lower thermal expansion coefficient than steel.

It is another object of the invention to provide such a shadow mask which can be formed at room temperature.

It is yet another object of the invention to provide such a shadow mask which has a higher modulus of elasticity than invar.

In accordance with the invention, a shadow mask for a color CRT is formed from a bilayer composite of steel and invar, the thicknesses of steel and invar chosen to take advantage of the lower thermal expansion coefficient of invar and the room temperature formability and higher modulus of elasticity of steel. Moreover, when the composite is formed to have the invar side face the display screen of a CRT, the bimetal effect enhances the reduction in doming due to the low thermal expansion coefficient.

In accordance with the invention, the volume percent of steel in the composite is chosen to lie within the range of from about 60% to about 95%, and preferably in the range of from about 70% to about 85%.

In accordance with another aspect of the invention, there is provided a color cathode ray tube comprising: a glass envelope including neck, funnel and face panel portions; an electron gun mounted in the neck portion; a display screen on the inside of the face panel, the screen comprising cathodoluminescent phosphor elements; and a shadow mask mounted between the electron gun and the screen, the shadow mask comprising an apertured and formed metal sheet; characterized in that the shadow mask is formed of a composite material consisting of a layer of steel and a layer of invar, the volume percent of steel in the composite being within the range of from about 60% to about 95%, and preferably in the range of from about 70% to about 85%. This corresponds to a thickness ratio of steel to invar of from 1.5 to about 19, and preferably in the range of from 2.3 to 5.6.

In a preferred embodiment of such a color cathode ray tube, the mask is formed and mounted so that the invar layer faces the display screen.

BRIEF DESCRIPTION OF THE DRAWING

These and other features of the present invention, and their advantages, are illustrated specifically in embodiments of the invention which will now be described, by way of illustration, with reference to the accompanying drawings, in which.

The figures are diagrammatic and not drawn to scale. The same reference characters are used to refer to corresponding or similar features in different embodiments.

DESCRIPTION OF THE PREFERRED EMBODIMENTS

Color CRTs for color television produce an image display on a cathodoluminescent screen composed of a repetitive array of red, blue and green phosphor elements, by scanning the array with three electron beams from an electron gun in the neck of the CRT, one beam for each of the primary (red, blue and green) colors. The beams emanate from separate gun apertures, converge as they approach the screen, pass through an aperture of a mask positioned a short distance behind the screen, and then diverge slightly to land on the appropriate phosphor element. At a comfortable viewing distance, the human eye cannot resolve the individual red, blue and green elements in the screen, but rather integrates these primary colors to perceive additional colors produced by the primary colors.

Early CRTs for color television had screens composed of arrays of phosphor dots, but dot screens have been largely replaced by screens composed or arrays of vertically oriented phosphor stripes. As is known, such screens are primarily advantageous in alleviating the requirement for accurate registration between the mask and the screen in the vertical direction.

The masks for these striped screens are composed of vertically oriented columns of slot-shaped apertures separated from one another by so-called "bridges" or "tie-bars" of mask material, which tie the mask together to provide needed mechanical strength.

Figure 1:
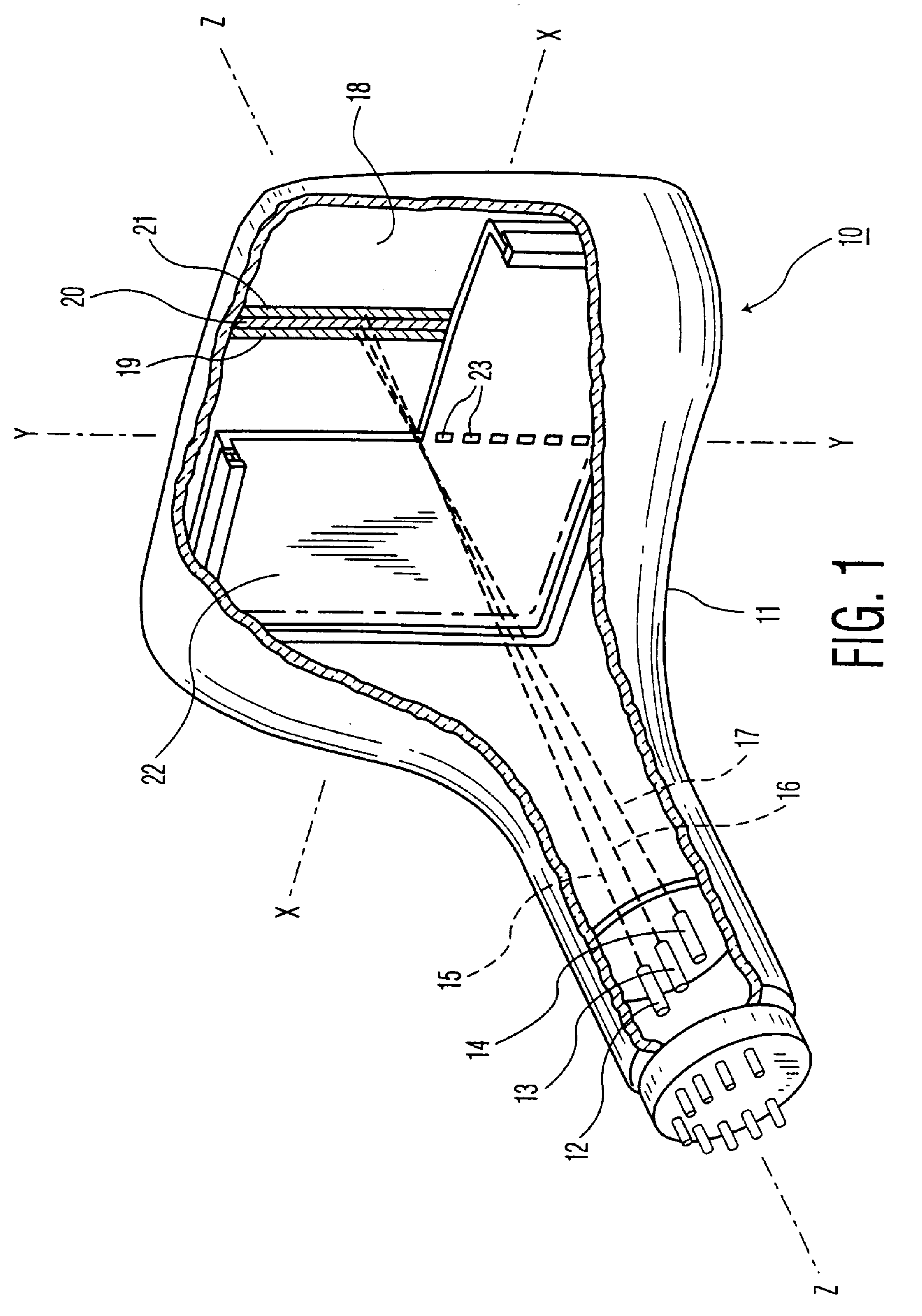
FIG. 1 is a perspective view, partly cut away, of one embodiment of a color CRT incorporating a composite shadow mask of the invention.

Referring now to FIG. 1, color CRT 10 is composed of evacuated glass envelope 11, electron guns 12, 13 and 14, which direct electron beams 15, 16 and 17 toward screen 18, composed of alternating red, blue and green phosphor stripes, three of which, 19, 20 and 21 are shown. The beams 15, 16 and 17 have to converge on the phosphor screen 18. The distance between the apertured mask 22 and the phosphor screen 18 has to be chosen in such a way that beams 15, 16 and 17 land on the appropriate phosphor stripe 19, 20 or 21. Additional columns of apertures similarly correspond to additional stripe triplets, not shown. External deflection coils and associated circuitry, not shown, cause the beams to scan the mask and screen in a known manner, to produce a rectangular raster pattern on the screen.

Figure 2:
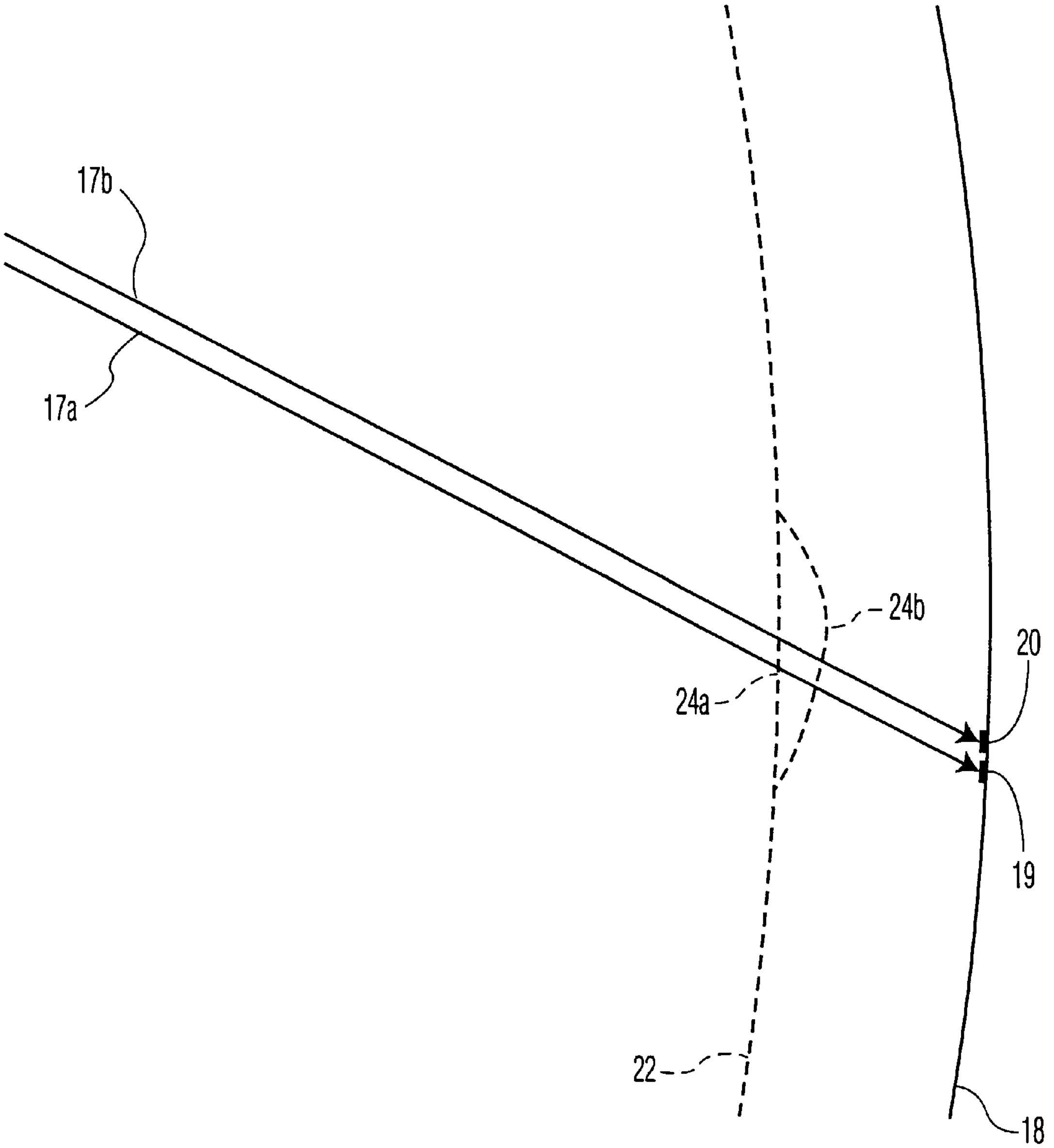
FIG. 2 is a schematic section view of portions of the mask and screen taken along the X axis of FIG. 1, illustrating the effect of doming on registration.

FIG. 2 shows the effect of localized doming on registration between the mask apertures and the phosphor stripes, and the effect on color purity of the display on the screen. Electron beam 17 initially follows path 17*a* to pass through aperture 24 at position 24*a* in mask 22 to land on the red phosphor stripe 19 on screen 18. Due to the effect of localized heating by the electron beams, a portion of mask 22 then bulges or "domes" outward, moving aperture 24 forward to position 24*b*, causing beam 17 to follow path 17*b* through aperture 24*b* to land on adjacent blue stripe 20. This degrades the color purity of the resultant display on the screen. One way of reducing the effect of such misregistration is to reduce the size of the apertures, thereby increasing the "color purity reserve" i.e., the tolerance for beam landing errors. However, this reduces the mask transmission, and thus reduces the brightness of the display.

Figure 3:
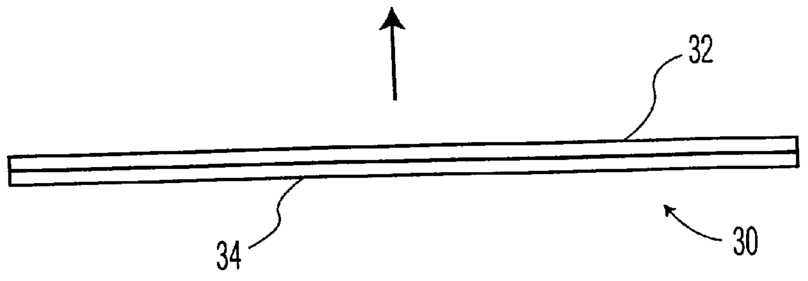
FIG. 3 is a schematic diagram of a flat composite sheet of steel and invar for use in forming a shadow mask of the invention.

In accordance with the invention, such doming is reduced by the use of a composite shadow mask of the invention comprising steel and invar. The mask may be formed from a flat composite sheet, shown schematically as sheet 30 in FIG. 3, having steel and invar sheet members 32 and 34, respectively. This composite sheet is formed to have a slight curvature, the degree of curvature being such as to approximately match the curvature of the display screen. Such forming is typically achieved by pressing.

A particular advantage of the invention is that the amount of invar in the composite sheet, while sufficient to result in a significant reduction in doming, is nevertheless sufficiently low relative to steel as to allow forming to be carried out at low temperatures, even room temperature. As is known, invar masks must be formed at about 200° C., requiring expensive heated dies.

Figure 4:
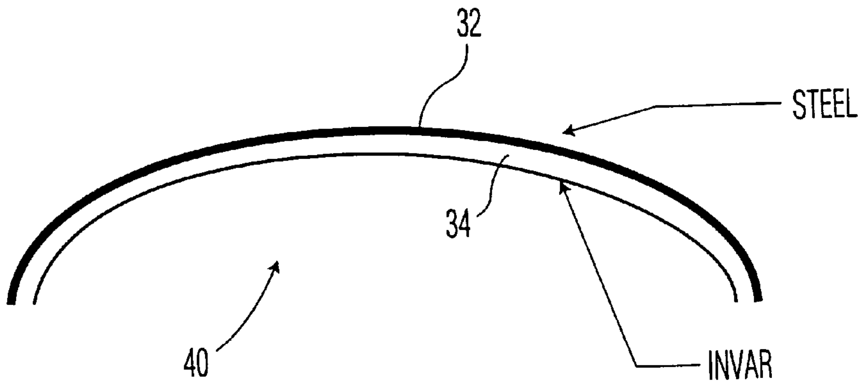
FIG. 4 is a schematic diagram of a formed composite shadow mask of the invention, formed with the steel layer on the screen side of the mask.
Figure 5:
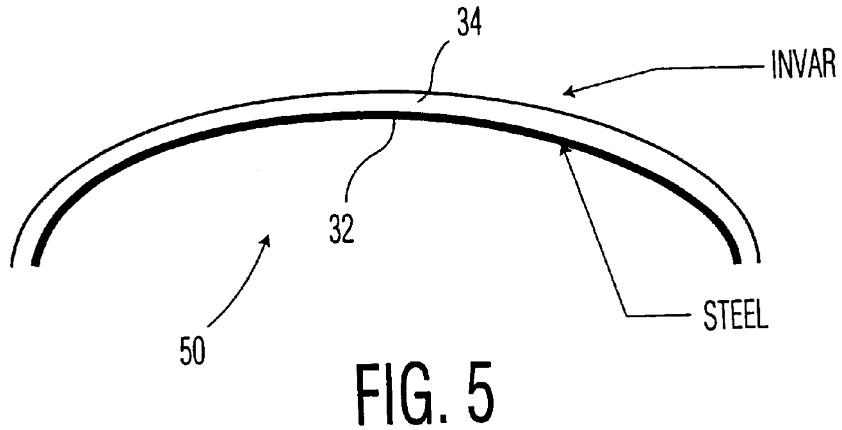
FIG. 5 is a schematic diagram of a formed composite shadow mask of the invention, formed with the invar layer on the screen side of the mask.

Referring now to FIG. 4, there is shown schematically a formed composite shadow mask 40 of the invention, formed with the steel layer 32 on the convex side of the mask, ie, the side which will face the screen when mounted in the CRT as shown in FIG. 1, and invar layer 34 on the concave side, ie, the gun side. FIG. 5 shows a formed mask 50 which is similar to that of FIG. 4, except that the orientation of the composite member layers is reversed.

The effect on doming of these composite masks as compared to all steel masks was studied for two different amounts of invar, expressed in terms of the percentage of the total thickness of the composite. For each thickness, percentage improvement in doming over the standard steel mask with the same curvature is reported for three different configurations, respectively designated case 1 (formed mask, steel on the screen side), case 2 (formed mask, invar on the screen side) and case 3 (flat mask).

The local doming behavior was measured by the following technique. The mask was modeled by using commercial and robust Finite Element Analysis software. Next, measured temperature distributions noticed from typical heat inputs that cause the mask to undergo local doming deformation was input into the Finite Element model. The composite masks and the all-steel masks, each of a total thickness of 175 micrometers were modeled with 8 node brick elements. Using the measured temperature distributions, the deformation of the masks was calculated using the Finite Element Analysis software. In Table I, are provided the improvements for the different cases, over the all-steel mask.

TABLE I

| | Case 1: Invar towards electron gun side | Case 2: Invar towards screen side | Case 3: Flat mask |
|---|---|---|---|
| 27% Invar/73% Steel | 12% less movement than all Steel Mask | 22% less movement than all Steel Mask | Large movement away from Invar Side |
| 15% Invar/85% Steel | 8% less movement than all Steel Mask | 12% less movement than all Steel Mask | Large movement away from Invar Side |

The fact that steel has a larger coefficient of thermal expansion than invar, and that the coefficient of expansion of the composite structures can be calculated using the rule of mixtures, lead to the prediction of certain behaviors for each of the cases 1 through 3. Two effects are expected for each structure, first, a bimetal effect caused by the differing thermal expansion coefficients of the steel and invar members, and second, an overall lowering of the thermal expansion coefficient of the composite as compared to steel, due to the presence of invar.

The first effect is seen in case 3 as a movement away from the invar side. The second effect is seen in the improvement in doming over an all steel mask. The fact that a greater improvement is seen in case 2 than in case 1 can be explained by the fact that the bimetal effect is contributing to the improvement by inducing movement away from the screen during heating. Thus, case 2 constitutes a preferred embodiment of the invention.

Table II presents values of Thermal Expansion Coefficient, Yield Stress and Elastic Modulus for the 15% and 27% invar composites, the percent improvement in TEC, over an all-steel mask, and the percent improvement in Yield Stress and Buckling Strength over an invar mask.

TABLE II

| | 15% Invar Composite | 27% Invar Composite |
|---|---|---|
| Thermal Expansion Coefficient (TEC) | $0.15 \times 1.6 \times 10^{-6} + 0.85 \times 11.6 \times 10^{-6} = 10.1 \times 10^{-6}$/° C. | $0.27 \times 1.6 \times 10^{-6} + 0.73 \times 11.6 \times 10^{-6} = 8.9 \times 10^{-6}$/° C. |
| % Improvement (decrease) of TEC over Steel | 13% | 23% |
| Yield Stress | $0.15 \times 40 + 0.85 \times 16 = 19.6$ KSI | $0.27 \times 40 + 0.73 \times 16 = 22.5$ KSI |
| Improvement (decrease) in Yield Stress over Invar (better formability and ability to form at room temperature) | 51% | 44% |
| Elastic Modulus | $0.15 \times 20 \times 10^6 + 0.85 \times 30 \times 10^6 = 28.5 \times 10^6$ PSI | $0.27 \times 20 \times 10^6 + 0.73 \times 30 \times 10^6 = 27.3 \times 10^6$ PSI |
| Improvement (increase) in Buckling Strength over Invar | 42% | 37% |

The invention has been necessarily described in terms of a limited number of embodiments and variations. Other embodiments and variations of embodiments will become apparent to those skilled in the art, and are intended to be encompassed within the scope of the appended claims.

What I claim as my invention is:

1. A shadow mask for a color CRT comprising an apertured and formed sheet of a composite material, characterized in that the composite material consists of a layer of steel and a layer of invar, the volume percent of steel in the composite material being within the range of from about 60% to about 95%.

2. The shadow mask of claim 1 in which the volume percent of steel in the composite material is in the range of from about 70% to about 85%.

3. A color cathode ray tube comprising: a glass envelope including neck, funnel and face panel portions; an electron gun mounted in the neck portion; a display screen on the inside of the face panel, the screen comprising cathodoluminescent phosphor elements; and a shadow mask mounted between the electron gun and the screen, the shadow mask comprising an apertured and formed metal sheet; characterized in that the shadow mask is formed of a composite material consisting of a layer of steel and a layer of invar, the volume percent of steel in the composite material being within the range of from about 60% to about 95%.

4. The color cathode ray tube of claim 3 in which the volume percent of steel in the composite material is in the range of from about 70% to about 85%.

5. The color cathode ray tube of claim 3 in which the mask is formed and mounted so that the invar layer faces the display screen.

6. The color cathode ray tube of claim 3 in which the mask is formed and mounted so that the steel layer faces the display screen.

* * * * *